United States Patent [19]

Longshore

[11] 4,160,045
[45] Jul. 3, 1979

[54] METHOD FOR PRODUCING A SCABROUS PHOTOSENSITIVE SURFACE

[75] Inventor: Randolph E. Longshore, Alexandria, Va.

[73] Assignee: The United States of America as represented by the Secretary of the Army, Washington, D.C.

[21] Appl. No.: 928,033

[22] Filed: Jul. 25, 1978

[51] Int. Cl.² .............................................. B05D 3/06
[52] U.S. Cl. ...................................... 427/38; 427/162
[58] Field of Search ..................... 427/38, 39, 40, 162, 427/166

[56] References Cited

U.S. PATENT DOCUMENTS 4,005,698  2/1977  Cuomo et al. ...................... 427/162

OTHER PUBLICATIONS

Kemlage et al. "IBM Tech. Disc. Bull." V. 19, #9, Feb. 1977, pp. 3378-3379.

Primary Examiner—John H. Newsome
Attorney, Agent, or Firm—Nathan Edelberg; Milton W. Lee; Aubrey J. Dunn

[57] ABSTRACT

A layer of indium is deposited as small islands on a photosensitive material. The islands and the material not covered by the islands are bombarded with ions to cause sputtering of the islands and the material. When the islands have been sputtered away, the material has a surface consisting of cones and pyramids. Such a surface is more efficient at absorbing photons than is a smooth surface.

3 Claims, 1 Drawing Figure

U.S. Patent
Jul. 3, 1979
4,160,045
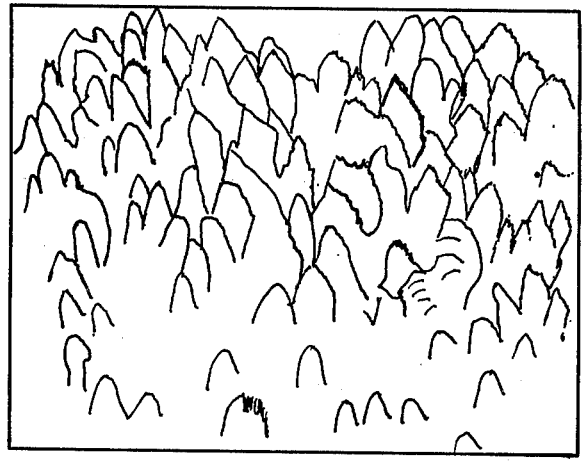

METHOD FOR PRODUCING A SCABROUS PHOTOSENSITIVE SURFACE

The invention described herein may be manufactured, used, and licensed by the U.S. Government for governmental purposes without the payment of any royalties thereon.

BACKGROUND OF THE INVENTION

This invention is in the field of photosensitive devices such as solor cells. In particular it deals with roughening the surfaces of such devices to increase sensitivity. A known process for roughening silicon solar cells uses KOH or NaOH on the <100≦ crystal surface. This process produces a surface covered with a regular array of small pyramids. Such a surface yields two benefits (1) the incoming beam of photons is reflected multiple times and has more chances to be absorbed, (2) photons which penetrate the sides of the pyramids are refracted and travel obliquely through the silicon. Benefit (2) allows photons to be absorbed closer to the cell junction to give an increase in collection efficiency and allows more photons to be absorbed both because the path length of photons is longer than with a smooth surface and light within the cell will be totally reflected from the surface. This process has the disadvantages of being dependent on crystal orientation, of not being generally applicable to all photosensitive materials, of being vacuum incompatable, of having little control of pyramid size and shape, and of exposing the surface to the atmosphere at completion of the process whereby the surface may be contaminated before protective or antireflection surfaces can be applied. My invention has the benefits associated with the known process, but none of the disadvantages as listed above.

SUMMARY OF THE INVENTION

The invention is a method for producing a scabrous surface on a photosensitive material. The method is carried out under high vacuum and includes the steps of coating the material with small islands of a protective material such as indium and bonbarding the material and islands with ions to cause sputtering of both the islands and the material between the islands. The material beneath the islands will be protected against sputtering until the islands have sputtered away. A surface is thus produced that consists of many small, sharp cones and pyramids. The island material is deposited on the surface by evaporation.

BRIEF DESCRIPTION OF THE DRAWING

The FIGURE shows a sketch of a scanning-beam electron microscope photograph of a surface produced in accordance with the invention.

DETAILED DESCRIPTION OF THE INVENTION

The invention basically includes two method steps. Starting in a vacuum with a material such as silicon, I first deposit, as by evaporation for 10–20 seconds, a discontinuous thin layer of indium on the surface of the silicon. This layer may be on the order of 500–1000A thick, and forms small islands 1000–2000A in diameter. The thickness and size of the islands may be controlled by varying the evaporation time of the indium. I then bombard the surface of the silicon between the islands and the islands with an argon ion beam accelerated to a potential of 1000–2000 volts. This bombardment causes sputtering of the islands and the silicon between the islands until the islands are gone. I cease bombardment after 50–100 minutes to end my method. The silicon is thus left with a surface covered with many small, sharp cones and pyramids, as may be seen on the drawing FIGURE. This surface is ready for immediate coating with an antireflection coating or a protective coating, with no cleaning, or may be formed into a detector for attaching connecting leads.

A specific example of my method is as follows: evaporation time for indium—20 seconds; mean island thickness—1000A mean island diameter—2000A approximate center-to-center spacing of islands—2000A bombardment time by argon ions—100 minutes accelerating voltage for ions—1000 volts Although I have described a specific embodiment of my invention, other embodiments will be obvious to ones skilled in the art, but will be within the scope of my invention. For example, materials other than silicon may be prepared by my invention. These materials may include but are not limited to germanium, lead tin telluride, indium antimonide, etc. Moreover, ions other than of argon may be used, or electrons or other charged particles may be used for bombardment.

I claim:

1. A method for producing, in a vacuum, a scabrous finish on a surface, including the steps of:
   depositing on said surface small islands of a protective material; and
   bombarding said surface and said islands with charged particles to remove said islands and the surface between said islands by sputtering.

2. The method as recited in claim 1 wherein the step of depositing is performed by evaporation of said material.

3. The product as produced by either claim 1 or 2.

* * * * *